United States Patent [19]

Campisi

[11] Patent Number: 5,041,944
[45] Date of Patent: Aug. 20, 1991

[54] UNITARY CHASSIS AND FRAME FOR TELEVISION RECEIVERS

[75] Inventor: Carl Campisi, Chicago, Ill.

[73] Assignee: Zenith Electronics Corporation, Glenview, Ill.

[21] Appl. No.: 442,083

[22] Filed: Nov. 28, 1989

[51] Int. Cl.$^5$ .............................................. H05K 5/00
[52] U.S. Cl. ................................... 361/399; 361/415; 358/254; 455/348
[58] Field of Search ................. 312/7.2; 361/380, 395, 361/399, 412, 429, 390, 415; 455/347, 348; 324/519; 358/254

[56] References Cited

U.S. PATENT DOCUMENTS 4,643,493  2/1987  Sides, Sr. et al. .................... 358/254
4,644,408  2/1987  Coleman ............................. 361/395

*Primary Examiner*—Leo P. Picard
*Assistant Examiner*—Donald A. Sparks

[57] ABSTRACT

A unitary chassis for an entire line of television receivers that permits all chassis components to be tested together. The chassis includes boards slidably mounted in a one piece plastic frame identical for all models. The chassis is easily assembled in a cabinet without the use of screws with a plurality of downwardly and forwardly projecting integral hooks on the frame that drop into and frictionally engage apertures in the bottom of the cabinet. A cabinet rear cover panel holds the frame in these cabinet apertures.

14 Claims, 10 Drawing Sheets

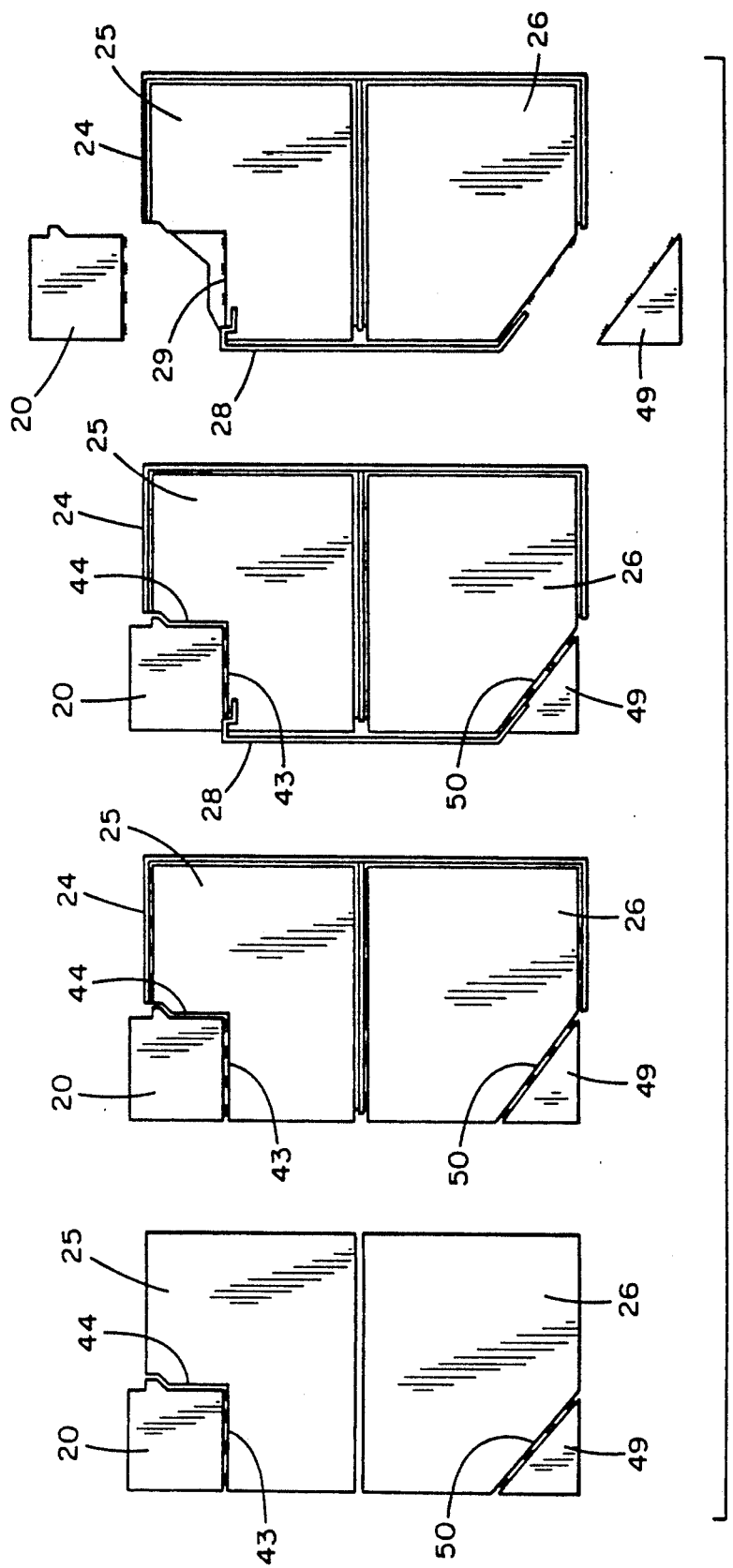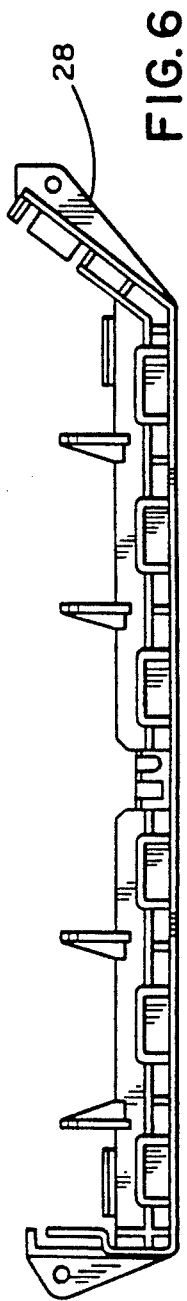
FIG. 5
FIG. 6

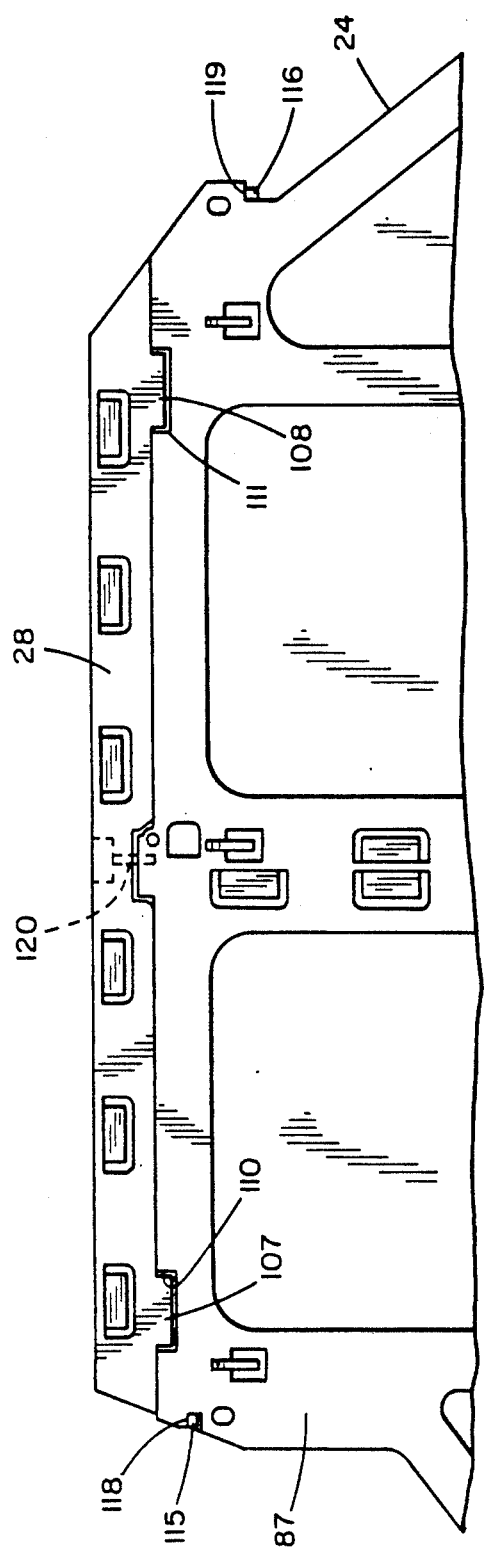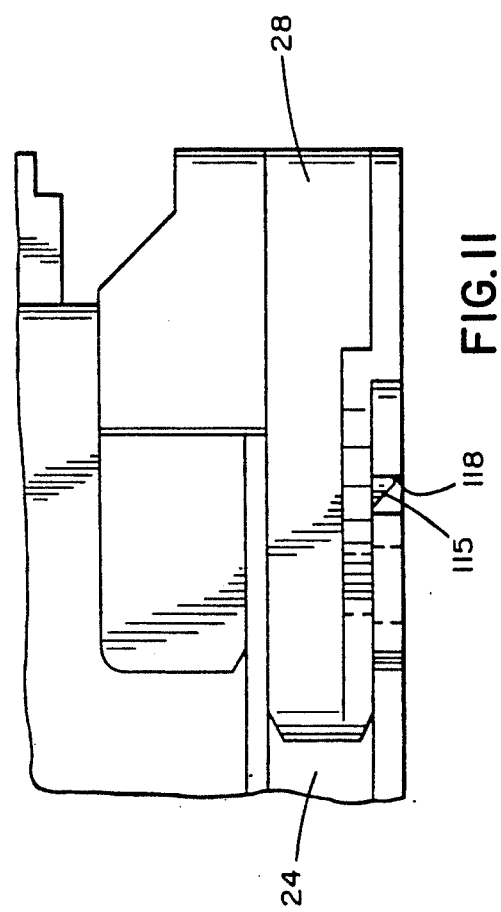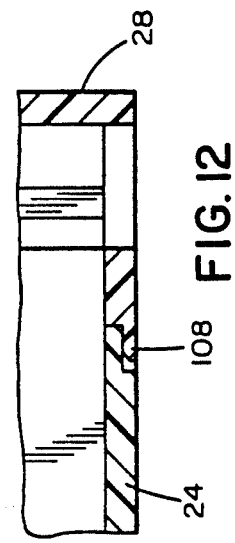

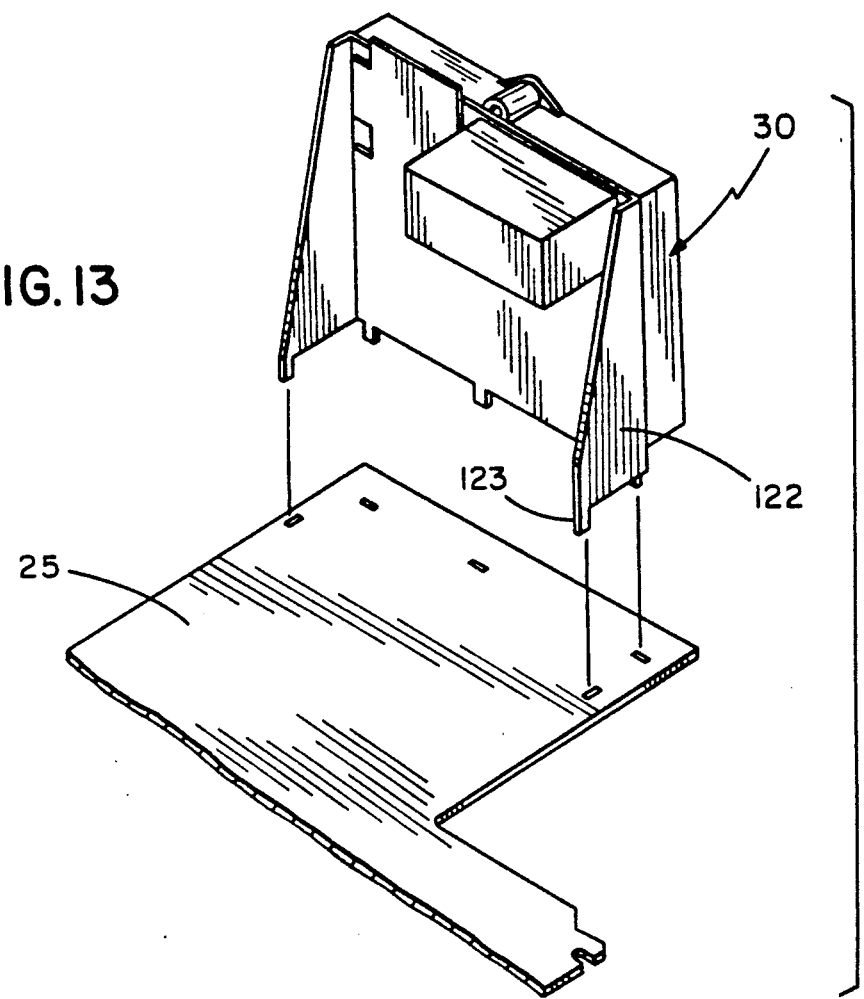
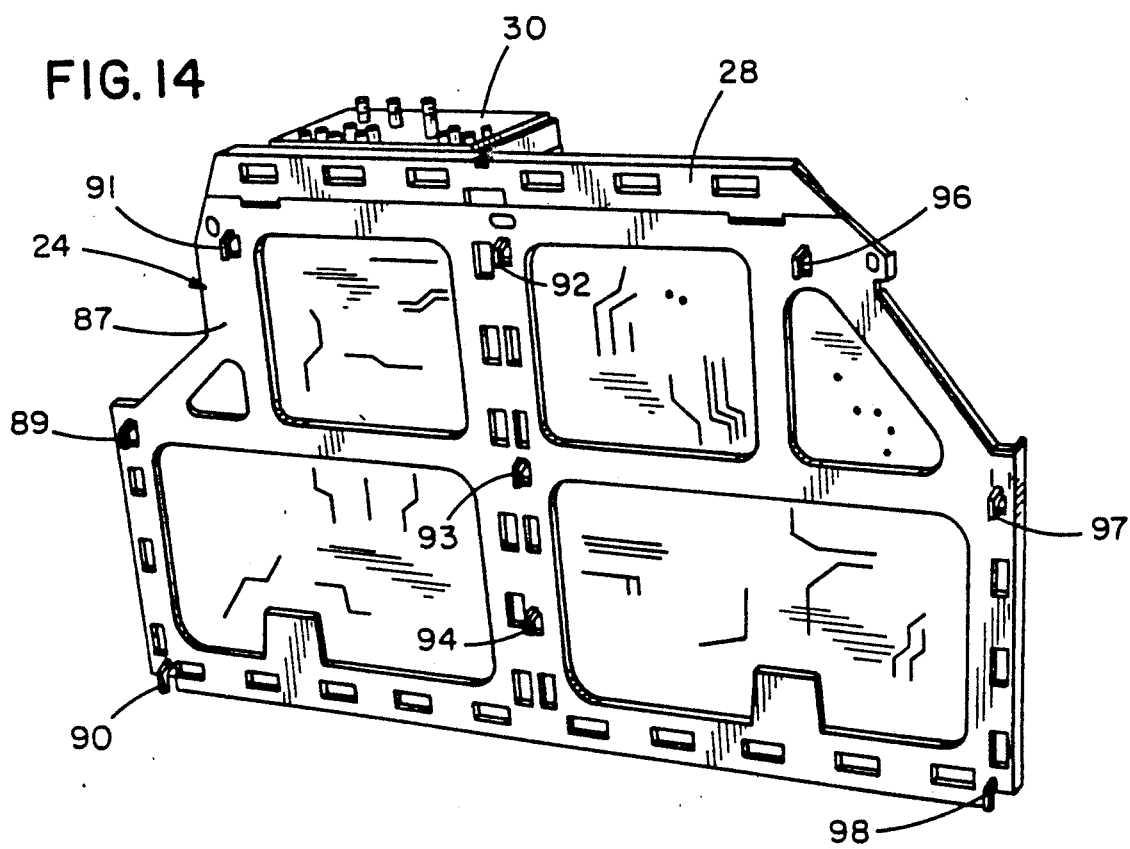

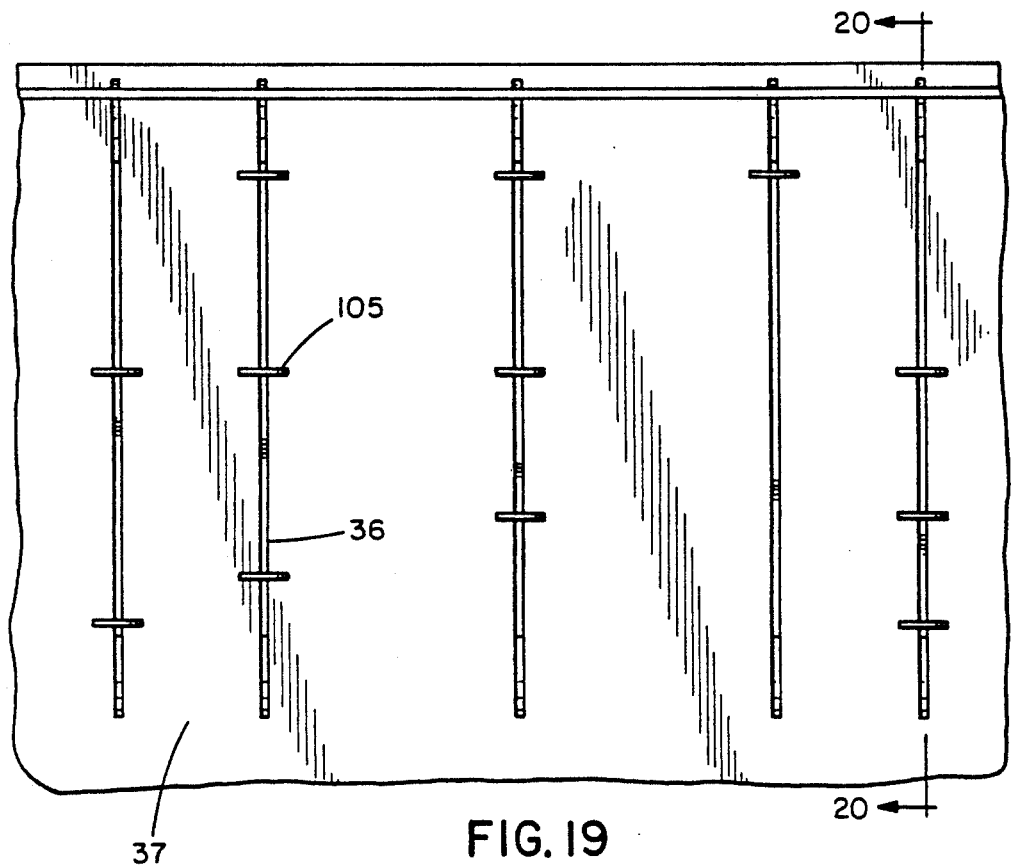
FIG. 19
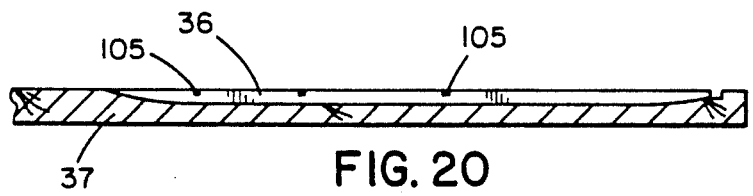
FIG. 20
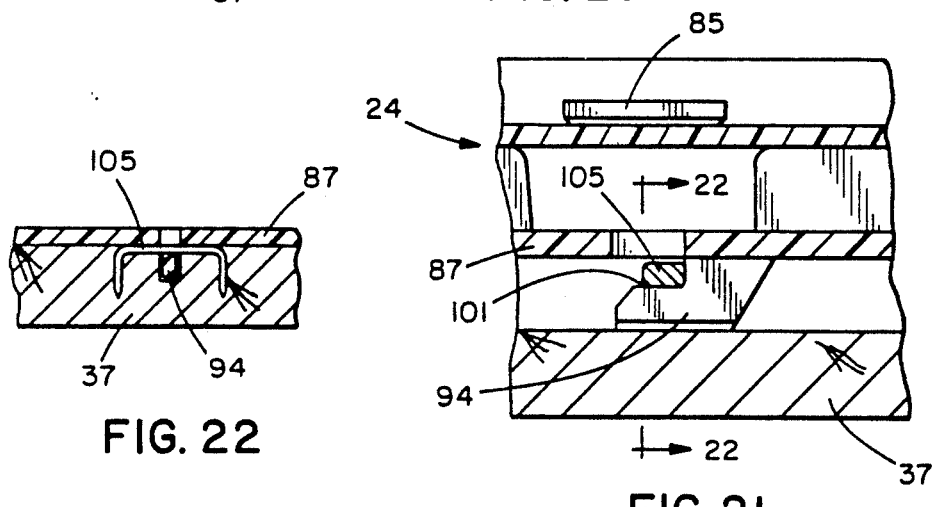
FIG. 22
FIG. 21

UNITARY CHASSIS AND FRAME FOR TELEVISION RECEIVERS

BACKGROUND OF THE INVENTION AND PRIOR ART

Over recent years it has been increasingly difficult to manufacture television receivers entirely at one location because of unit labor costs. In many instances the CRT will be made at one location, the chassis another and the cabinet a third.

These three components must then be brought together and assembled at one of the component locations or at a separate assembly plant. This divided manufacture is particularly useful for United States final assembly because United States unit labor costs are relatively high compared to many other parts of the world. It enables components that are labor intensive to be manufactured in a different country and shipped to an assembly location in the United States.

The divided manufacture of the chassis and associated circuitry has created unique problems. One of these results from the inability to test all the chassis circuitry at the chassis manufacturing location.

The chassis commonly includes R.F. and cable input circuitry, power supply circuitry, signal circuitry, circuitry for special features such as MTS stereo, video or CRT driving circuitry, and a jack receiving unit sometimes referred to as a "jack pack". These circuits or components are usually divided into a plurality of boards that are separately screwed into the cabinet at the final assembly location.

These separate boards are tested individually at the chassis manufacture location, but cannot be tested and trimmed there together because the individual boards and components are not dedicated to one another at the chassis assembly location.

Therefore, after the boards are shipped to the final assembly location and brought together in a single cabinet, the combination of boards are trimmed and tested. If at that point one or more of the boards is rejected, there is no capability of correcting the defective board because that capability is usually or conveniently only at the chassis manufacture location.

Thus, it would be highly desirable to dedicate all these boards and components at the chassis location so they may be trimmed and tested before shipment to the final assembly location. The final assembly location would then only have to insert the chassis, connect the video circuitry to the CRT, and testing would be largely limited to the CRT driver trimming. The present invention accomplishes these objectives.

Another problem in prior chassis assembly techniques is that the individual boards are connected with small screws to the cabinet. The use of these small screws inevitably results in extra loose screws in the cabinet even with good quality control. The extra screws are not a significant cost problem, but these loose screws can short circuitry or become wedged in locations that inhibit removal of components for repair.

It would, therefore, be desirable to eliminate the use of screws for these chassis components, and the present invention achieves this result.

A still further problem is at the chassis manufacture location where four or more separate manufacturing lines are utilized to make the chassis components including R.F. and cable input circuitry, power supply circuitry, signal circuitry, circuitry for special features such as MTS stereo, video or CRT driving circuitry, and the jack pack.

The power supply components change with the size of the picture tube. The additional feature circuitry varies with the particular receiver model. These variations make it difficult to change manufacturing lines from one model to another, and the resulting reticence to change frequently from one model to another, encourages excess inventories of certain models which down the economic line reduces corporate profits, and increases costs.

Therefore, it would be desirable to reduce the number of manufacturing lines at the chassis location and encourage and facilitate changing lines from one model to another.

The same problem is exacerbated by the different chassis sizes from one receiver to another. The physical size and configuration of the chassis components for a console are frequently dramatically different from table top units and these differences require greater changes in the manufacturing lines when switching models.

The present invention eliminates or minimizes this problem by providing a common chassis configuration for the entire array of television receivers from table top to large consoles.

SUMMARY OF THE PRESENT INVENTION

In accordance with the present invention, a unitary chassis is provided for an entire line of television receivers that permits all chassis components to be tested together at the chassis assembly location, shipped to a final assembly location, and assembled into a cabinet with a friction fit without the use of screws.

Toward these ends, all receivers have a common identical frame that includes a generally rectangular one-piece plastic injection molding that has two slots that receive only two circuit boards—a power supply board that varies from one CRT size to another, and a signal board that carries the input circuitry, tuner circuitry, additional features such as MTS stereo, video circuitry, and a jack pack that has soldered terminals to the signal board.

This chassis frame is connected to the cabinet with friction fit, the same for all models. The lower surface of the frame has a plurality of integral downwardly and forwardly projecting hooks that easily and simultaneously drop into and grip apertures in the cabinet as the chassis frame is slid forwardly into the receiver. The back cover of all receivers has similar locating elements that engage the rear of the frame and prevent rearward movement of the frame.

This simplifies assembly and also enables the entire chassis to be removed from the cabinet without tools after the rear cover has been removed—and it further eliminates the loose screw problem described above.

By mounting all the chassis circuitry and components to a common frame at the chassis assembly location, it can be tested and trimmed therefore minimizing rejects at the final assembly location.

There also are no screws mounting the boards to the frame. Toward this end the frame has two sets of inwardly projecting horizontal tabs that are spaced vertically the thickness of the two boards to define the slots. Both boards are slid into these slots at the chassis assembly location and held therein by a snap locking back frame member. This construction also facilitates quick removal of either board simply by removing the back frame.

Thus, all circuitry is dedicated at the chassis assembly location.

Other objects and advantages of the present invention will appear more clearly from the following detailed description.

BRIEF DESCRIPTION OF THE DRAWINGS

FIG. 5 is a collection of schematic top views illustrating the manufacture of the chassis assembly and particularly the removal of portions of the circuit board and the break away video drive board;

FIG. 6 is a top view of the rear frame member illustrated on the chassis in FIG. 4;

FIG. 10 is a fragmentary top view of the rear of the chassis frame with the rear frame member snap-locked thereto;

FIG. 11 is a fragmented left side view of the rear frame member attached to the chassis frame taken generally along line 11—11 of FIG. 4;

FIG. 12 is a fragmentary section showing the fit between the lower part of the back frame member and the frame, taken generally along line 12—12 of FIG. 4;

FIG. 13 is a fragmentary exploded perspective view of the rear part of the signal board illustrating the manner of mounting the jack pack thereto;

FIG. 14 is a bottom perspective of the chassis assembly according to the present invention also showing the rear of the jack pack;

FIG. 19 is a fragmentary top view of the bottom panel of the console cabinet illustrated in FIG. 3;

FIG. 20 is a longitudinal section taken generally along line 20—20 of FIG. 19;

FIG. 21 is a fragmentary section illustrating one of the chassis assembly projection hooks engaged in the console bottom panel illustrated in FIGS. 19 and 20, and;

FIG. 22 is a fragmentary cross-section taken generally along line 22—22 of FIG. 21.

DETAILED DESCRIPTION OF THE PREFERRED EMBODIMENT

Figure 1:
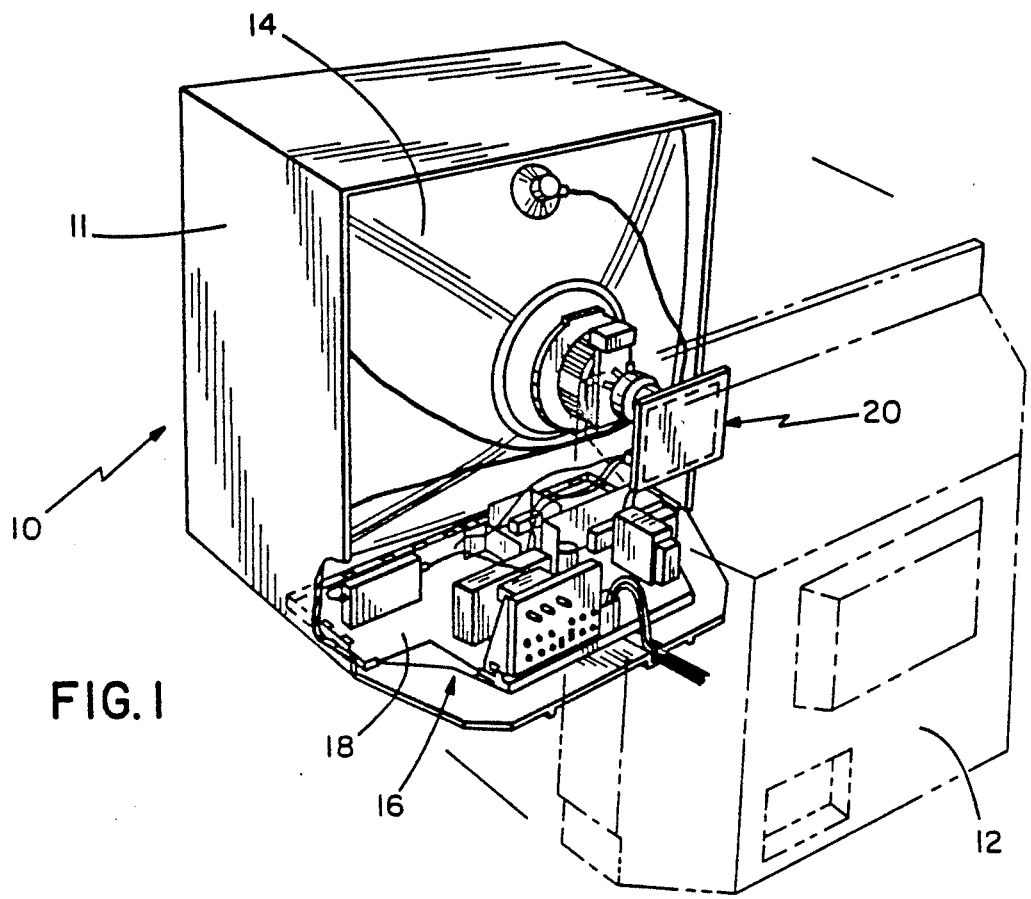
FIG. 1 is a rear perspective view of one television receiver according to the present invention with its rear cover panel removed illustrating its chassis.

Referring to the drawings and particularly FIGS. 1 to 4, a television receiver 10 is illustrated consisting of a table top cabinet 11 having a removable rear cover panel 12, a cathode ray tube 14 and a unitary chassis assembly 16 removably mounted on cabinet bottom panel 18.

The chassis assembly 16 initially includes a video drive circuit board 20 that is mounted to the rear of the CRT 14 upon final assembly as will appear more clearly hereinafter.

Figure 3:
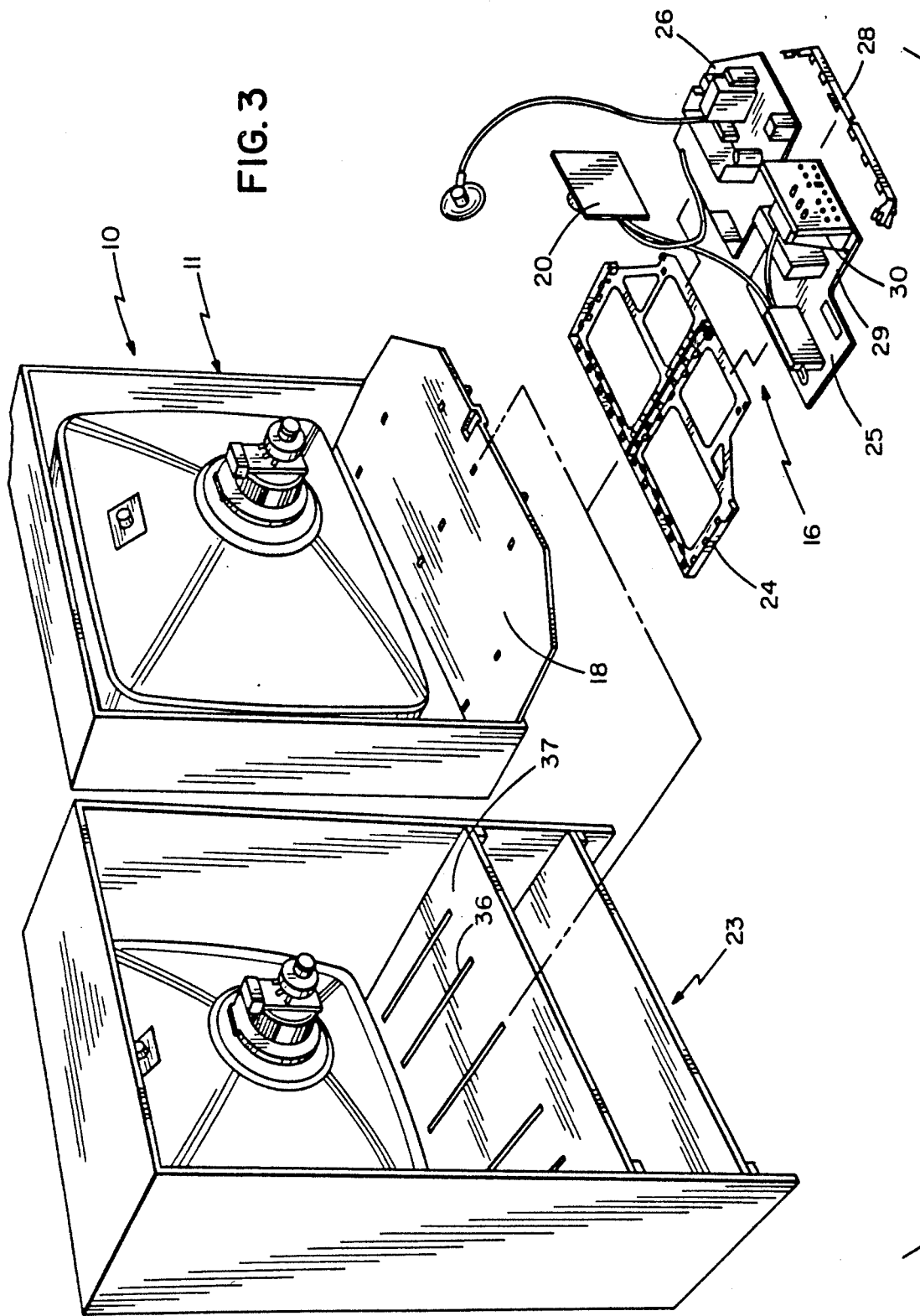
FIG. 3 is an exploded perspective illustrating the manner of mounting the chassis assembly according to the present invention in both table top and console television receiver models.

As seen in FIG. 3, the chassis assembly 16 with some modification to the circuitry therein, is adapted to be common to an entire line of television receivers including the table top receiver 10 illustrated in FIGS. 1 and 3, as well as consoles. Note console cabinet 23 illustrated in FIG. 3.

Figure 2:
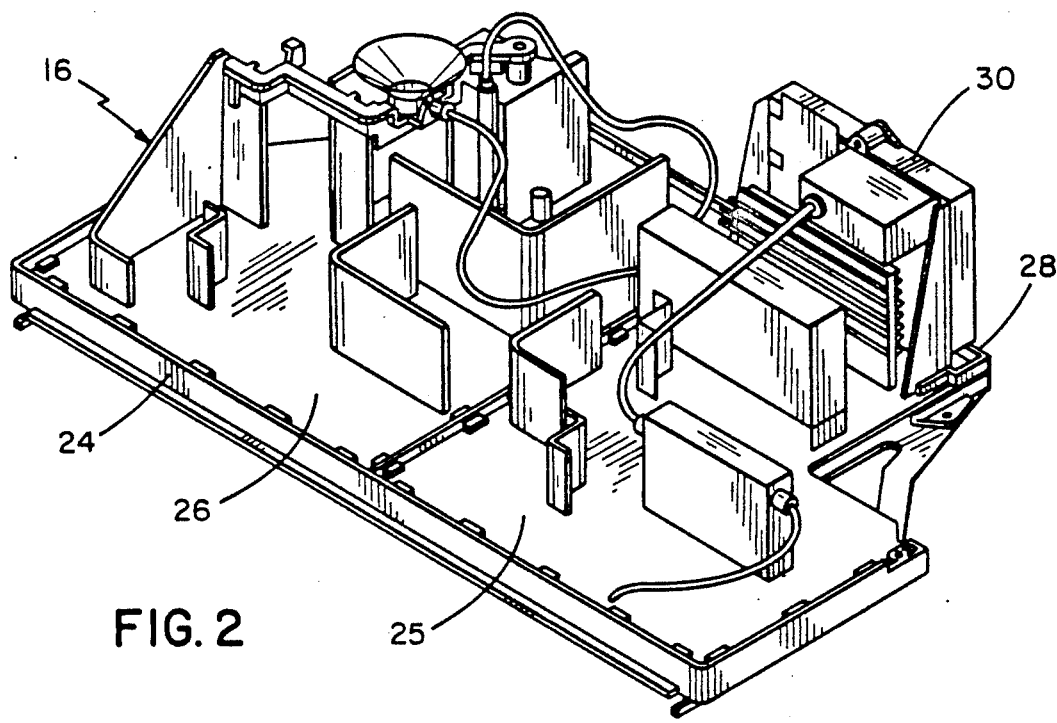
FIG. 2 is a front perspective of a chassis assembly according to the present invention but without the detail of all circuitry contained therein.

As seen clearly in FIGS. 2 and 3, the chassis assembly 16 includes a generally rectangular one-piece plastic injection molded frame 24 having slots that slidably receive a signal board 25 in a left slot therein and a power supply board 26 in a right slot therein. Circuit boards 25 and 26 are held in the chassis frame 24 by a back frame 28 that snap-locks to the rear of the main chassis frame 24 and is secondarily held thereto by a single central screw not shown in FIG. 3.

The signal board 25 as initially manufactured carries the video drive circuit board 20 at its left rear cut-out 29, which is broken away at final assembly and attached to the CRT as illustrated in FIG. 1.

The signal board 25 includes input circuitry, tuner circuitry, circuitry and components for additional features such as MTS stereo, the video circuit board 20 and a jack pack 30.

The signal board 25 is identical in size for all television receiver models with only some of its circuitry and components being modified to accommodate the different models.

The jack pack 30, however, is identical for all models and is mounted in exactly the same location on board 25 regardless of the receiver model. Furthermore, most of the terminals for the jack pack 30 are soldered to conductors on the circuit board 25 eliminating the need for much of the external wiring commonly associated with jack packs.

The power supply board 26 carries all of the power supply circuitry and components for the receiver and some are modified to accommodate different size CRTs in the television line. Similar to the signal board 25, however, the peripheral dimensions of the power supply board 26 remain the same for all models and hence the same chassis frame 24 is used on all receivers in the line.

An important aspect of the present invention is that each of the boards 25 and 26 is manufactured at the chassis manufacturing location on separate lines so that in essence the number of lines utilized to manufacture the chassis is substantially reduced over present technology. However, over and above the reduction in the number of lines required, the identical size configuration of each of the boards 25 and 26 regardless of model, the identical construction and location of jack pack 30 for all models, and the use of many common circuitry components on each of the boards 25 and 26 permit these two manufacturing lines to be easily switched from one model to another, significantly reducing manufacturing costs encouraging more frequent switch over from one model to another which in turn reduces unnecessary inventories.

Figure 4:
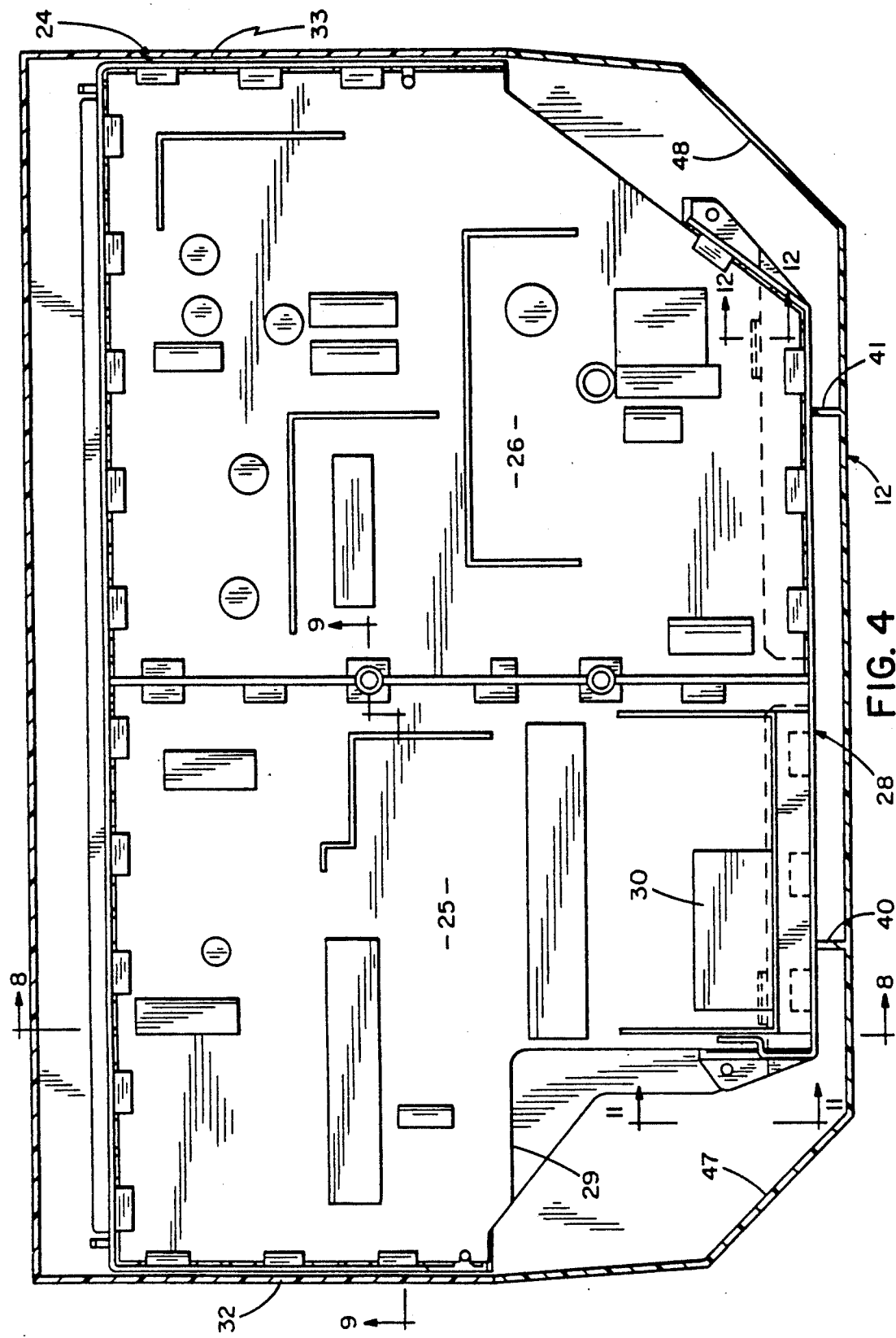
FIG. 4 is an enlarged top view of the chassis assembly illustrated in FIG. 2, again with details of circuitry eliminated for clarity.

As seen in FIG. 4, the sides of frame 24 are spaced just slightly inside cabinet side walls 32 and 33 so that as the chassis is slid into the cabinet, the cabinet side walls assist in guiding the chassis toward its locking position where it drops in and engages either rectangular apertures 34 in table top cabinet bottom panel 18 or slots 36 in console cabinet bottom panel 37, both shown in FIG. 3 and also described in more detail below.

As also seen in FIG. 4, the rear cover panel 12 has a pair of forwardly projecting integral stops 40 and 41 that engage the rear frame 28 and prevent the chassis from sliding rearwardly in the cabinet.

Viewing FIG. 5 in which a series of four diagrammatic top views of the main boards 25 and 26 is illustrated, in manufacture a rectangular video board 20 is originally formed as part of the signal board 25 with perforated L-shaped cut lines 43 and 44 that are sufficiently extensive to permit the manual break away of the video board 20 at the final assembly location. The video board 20 is located at the left rear of the signal board 25 in a position where some of board 25 would have to be cut away anyway to prevent interference with the rearwardly converging side wall 47 in the rear cover panel 12 as seen in FIG. 4. Furthermore, the location of video board 20 at the left rear of board 25 places it in a very convenient location for removal by the final assembler as he or she inserts the chassis into one of the cabinets.

The signal board 26, also as seen in FIG. 5, has a break away corner piece 49 at its right rear corner defined by diagonal perf cut line 50 in a similar manner to board 25, permitting it to be broken away but in this case discarded. Cut line 50 accommodates the tapered converging side wall 48 on rear cover panel 12 as seen in FIG. 4.

Figure 7:
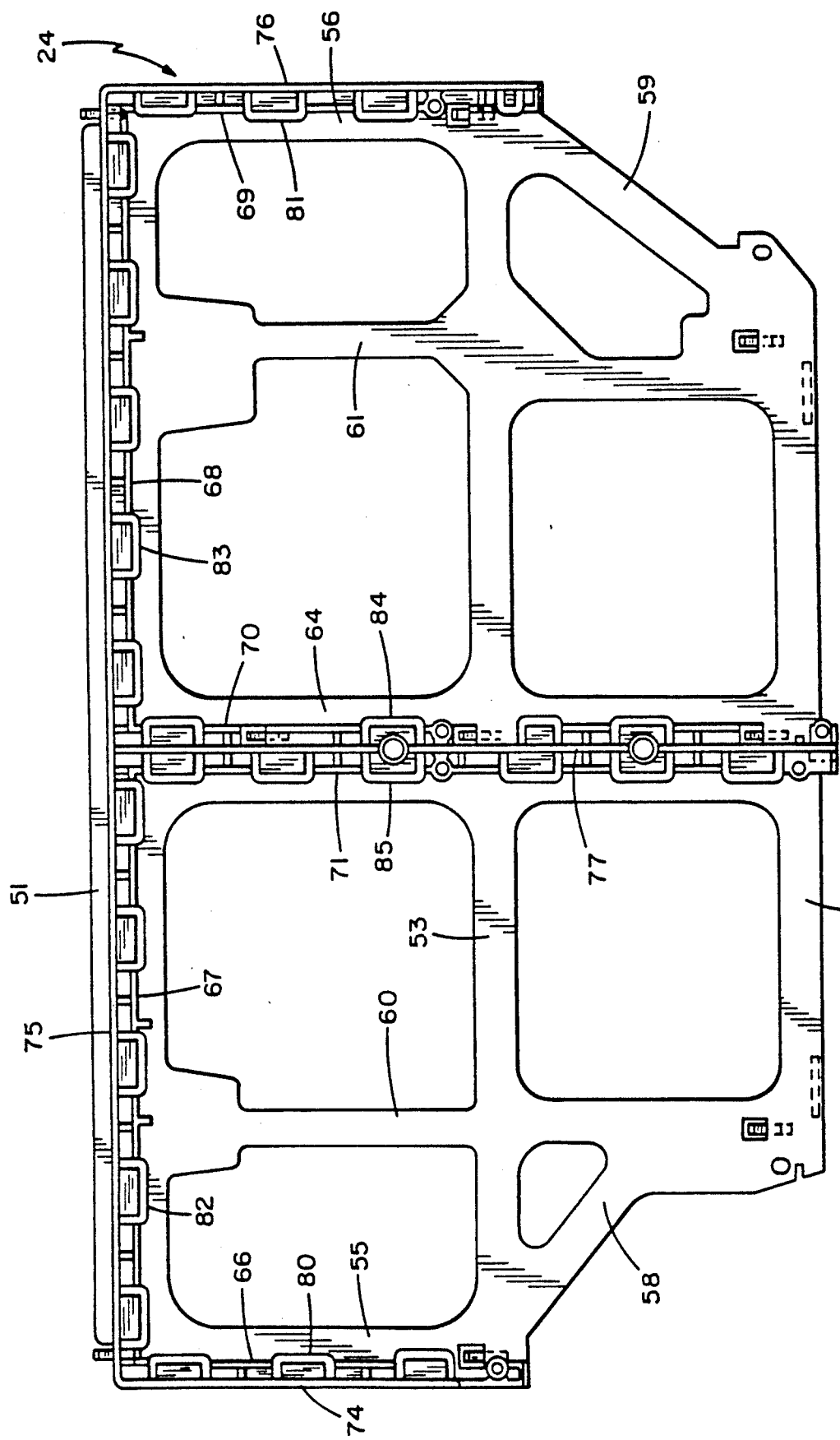
FIG. 7 is a top view of the chassis frame illustrated in FIG. 4 with the signal and power supply boards removed.

The details of the chassis frame 24, back frame member 28 and their manner of attachment to the cabinets are illustrated in FIGS. 6 to 12 and 14 to 22, and as seen from the top view of the frame illustrated in FIG. 7, it is a one-piece plastic injection molding of generally rectangular configuration including a front bar 51 parallel to a rear bar 52 and an approximately centrally positioned bar 53 connected together by left and right side bars 55 and 56 and generally rearwardly converging side bar portions 58 and 59. Stiffening bars 60 and 61 are provided parallel to the side bars 55 and 56. A forwardly extending central bar 64 is also provided between front and rear bars 51 and 52.

Figure 8:
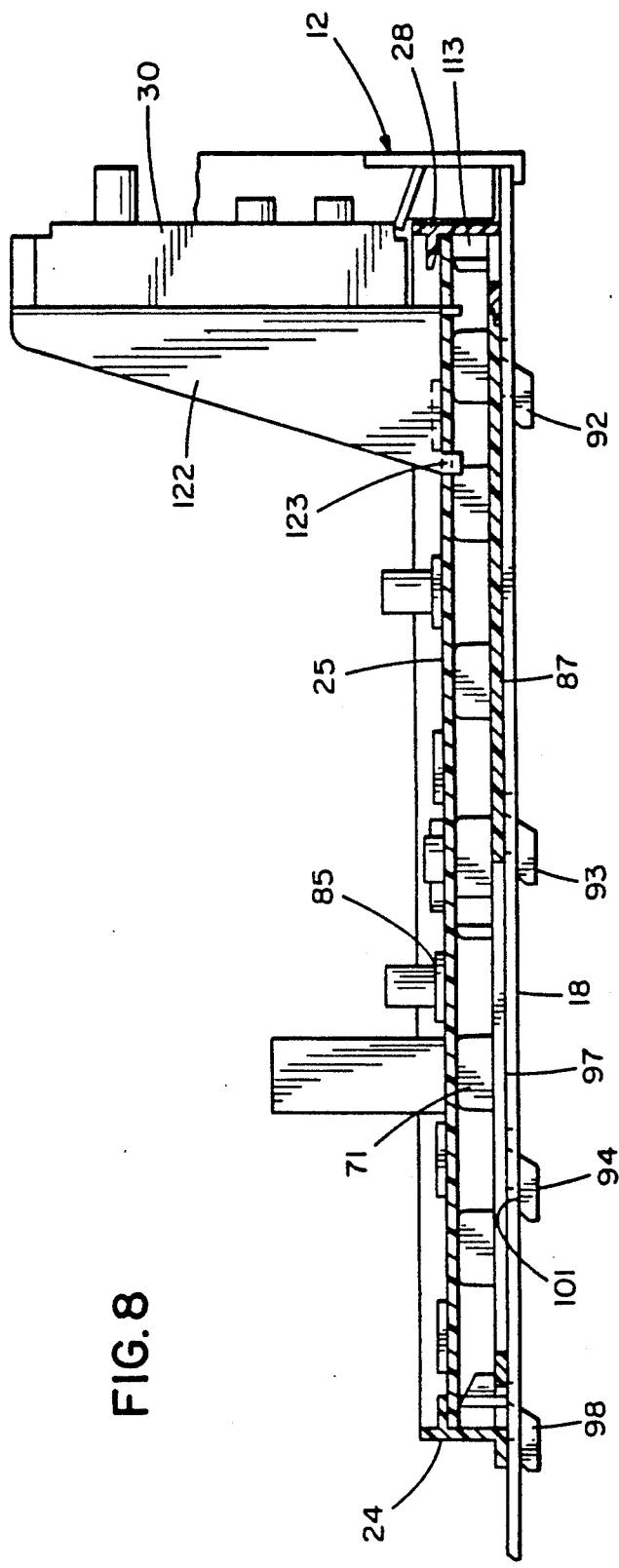
FIG. 8 is a cross-section of the chassis taken generally along line 8—8 of FIG. 4 illustrating the manner of mounting the circuit boards in the chassis frame.
Figure 9:
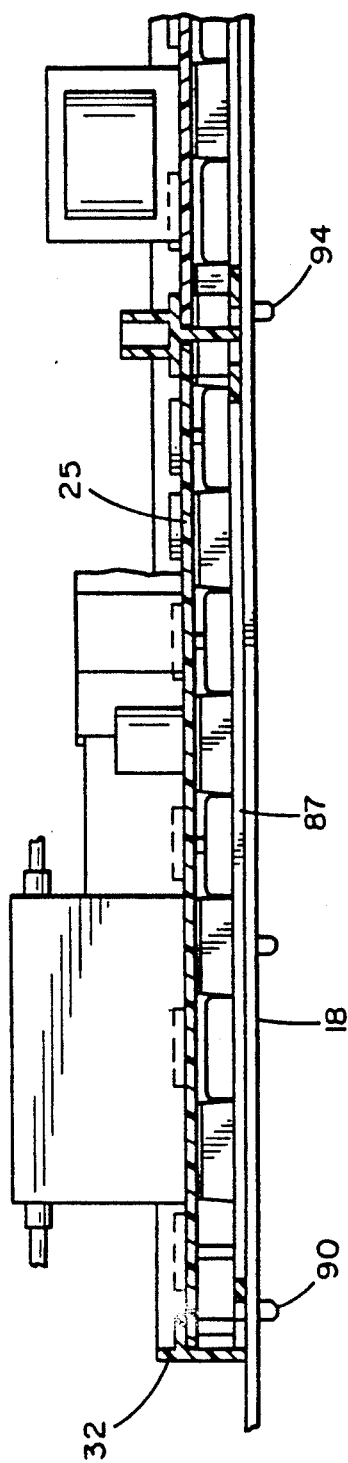
FIG. 9 is a fragmentary longitudinal section taken generally along line 9—9 of FIG. 4.
Figure 15:
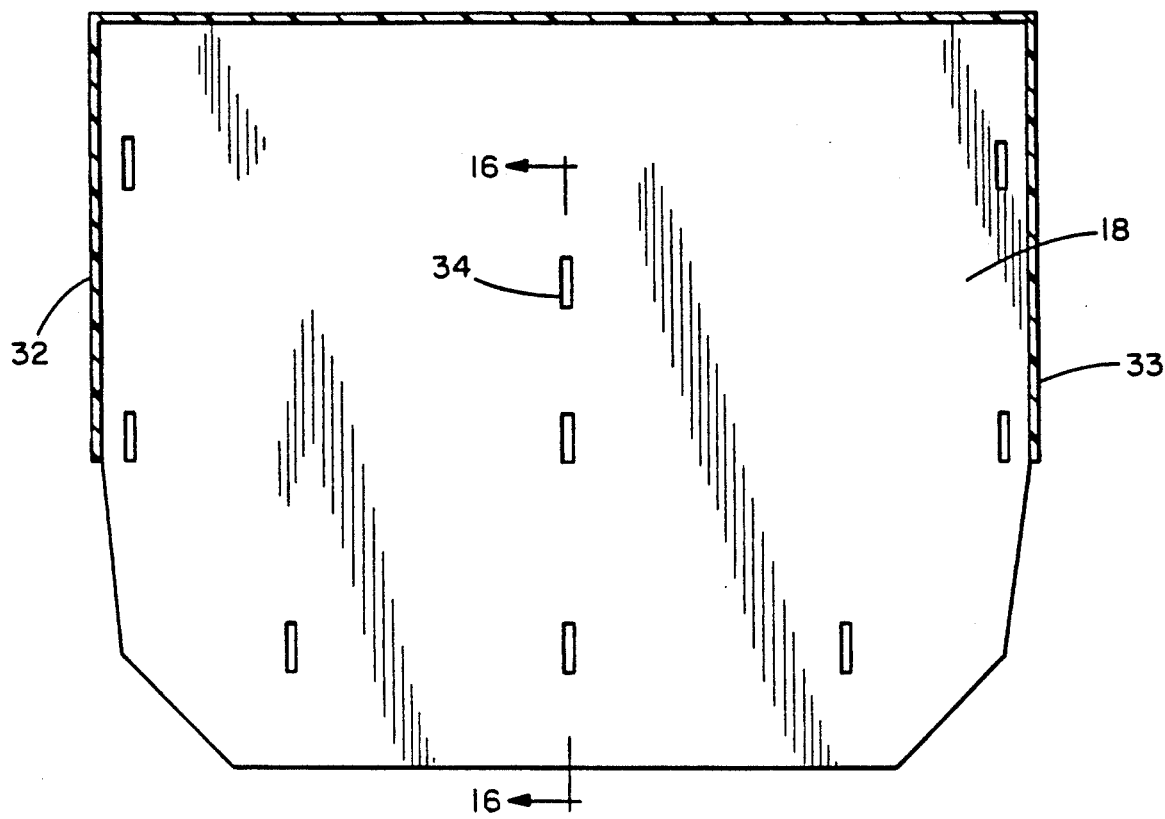
FIG. 15 is a top view of the cabinet bottom panel of the table top receiver illustrated in FIG. 3.
Figure 16:
FIG. 16 is a longitudinal section taken generally along line 16—16 of FIG. 15 showing the bottom wall apertures in the cabinet.
Figures 17, 18:
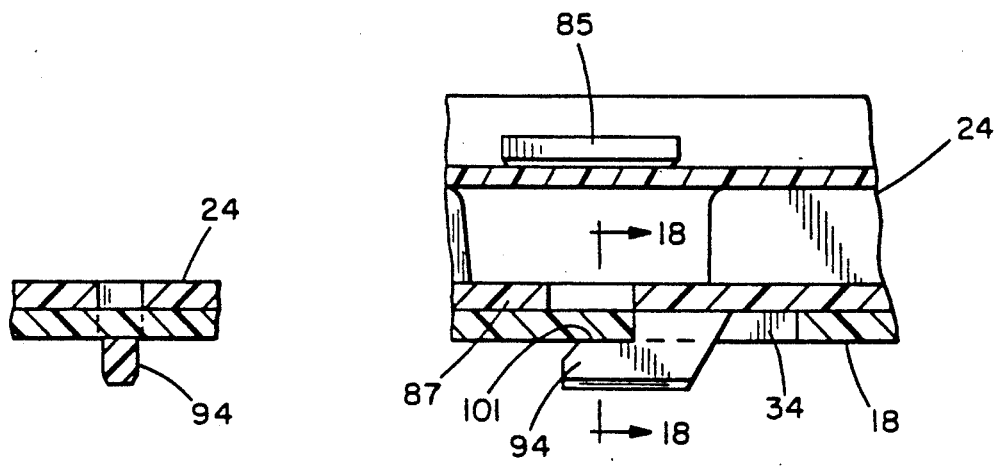
FIG. 17 is a fragmentary section showing one of the chassis assembly projections engaged in one of the table top apertures illustrated in FIGS. 15 and 16.
FIG. 18 is a fragmentary cross-section taken generally along line 18—18 of FIG. 17.

The frame 24 has two slots for respectively receiving left board 25 and right board 26 and toward this end, the side bars 55, 56, the front bar 51, and central bar 64 are each provided with a plurality of upwardly extending T-shaped projections 66, 67, 68, 69, 70 and 71 that have coplanar upper surfaces that slidably receive and engage the lower surfaces of the boards 25 and 26. The side bars 55, 56, the front bar 51 and central bar 64 are also provided with vertical upstanding walls 74, 75, 76 and 77 from which project a plurality of horizontally extending identical tabs 80, 81, 82, 83, 84 and 85 that have coplanar lower surfaces that slidably engage the upper surfaces of the boards 25 and 26. Tabs 80, 81, 82, 83, 84 and 85 are alternately positioned in the plane of FIG. 7 with the T-shaped projections 66, 67, 68, 69, 70 and 71. As seen in FIG. 8, T-shaped projections 71, etc. are spaced from horizontal tabs 85, etc. a distance slightly greater than the thickness of the boards 25 and 26 to engage but freely slidably receive the boards.

The chassis assembly 16 is designed to be connected to the bottom wall of the cabinets with a friction fit and without the use of tools. As seen in FIG. 14, there are a plurality of downwardly and forwardly projecting integral hooks from the lower surface 87 of the frame 24 including hooks 89, 90, 91, 92, 93, 94, 96, 97 and 98.

As seen more clearly in FIG. 8, each of these hooks has a horizontal upper surface 101 spaced from frame bottom wall 87 by the thickness of cabinet bottom wall 18. This relationship is shown enlarged in FIGS. 17 and 18, and in this way the hooks extend through apertures 34 and grip the lower surface of the cabinet bottom wall frictionally holding the chassis 16 to the bottom wall.

As seen in FIGS. 15, 16, 17 and 18, the apertures 34 in the cabinet bottom wall 18 are elongated forward to rear so that as the assembler slides the chassis forwardly into the cabinet, the frame hooks simultaneously drop into the identically positioned apertures 34 in the bottom wall 18 and with a further forward push against the back of the back frame member 28, the chassis slides slightly further forwardly frictionally engaging the frame hooks to the underside of the bottom wall 18.

The same frame hooks 89, 90, 91, 92, 93, 94, 96, 97 and 98 are utilized to hold the chassis in the console cabinet 23 shown in FIG. 3 and illustrated in enlarged detail in FIGS. 19 to 21. The bottom wall 37 of the console has five slots 36 therein spaced the same as the rows of hooks in the lower surface of frame 24 and each of these slots has staples 105 there-across located at the desired position with respect to the final position of the chassis such that they are engaged by the underside of the hooks all in a similar manner to the staple 105 and hook 94 illustrated in FIGS. 21 and 22.

In a similar manner to the table top cabinet, the chassis is slid forwardly on the console bottom wall 37 until each of the hooks drops into the slots 36 just behind the associated staple 105 and then with a further forward push the hooks engage the underside of the staples frictionally locking the chassis to the cabinet.

As described above, the stops 40 and 41 on the cabinet back panel engage the chassis frame to prevent disengagement of the hooks from the apertures 34 in the table top bottom wall and the staples 105 in the console bottom wall.

As seen in FIGS. 4, 7, 8, 10, 11 and 12, the back frame 28 snap-locks to the main chassis frame 24 and toward this end the back frame is provided with a pair of spaced forwardly extending tabs 107 and 108 (see FIGS. 10 and 12) that engage in complementary shallow recesses 110 and 111 in the rear bottom surface 87 of the chassis frame, which along with a plurality of forwardly projecting vertical tabs 113 (only one of which is shown in FIG. 8), prevent vertical movement of the back frame 28 with respect to chassis frame 24. Rearward sliding of the back frame 28 is prevented by a pair of integral detents 115 and 116 projecting downwardly from the back frame that respectively frictionally engage shoulders 118 and 119 on the frame 24. Frame 28 is attached to frame 24 by tilting it slightly downwardly as the tabs 107 and 108 engage in recesses 110 and 111 and then pivoting it upwardly so that vertical tabs 113 engage the top of frame wall 87 and the detents 115 and 116 frictionally engage shoulders 118 and 119. An optional central screw 120 may also be utilized if desired to provide additional fastening effort between the back frame 28 and the chassis frame 24.

As noted above the jack package 30 is identical for all receivers in the line and as seen in FIG. 13, includes a U-shaped frame 122 having downwardly projecting tabs 123 that fit through the signal board 25 and deform to fasten the jack pack 30 to the board. The various terminals associated with the jack pack 30 are soldered to wiring on the board but such has not been illustrated in FIG. 13 for simplification, but it should be understood that these connections are identical for the entire line of receivers and the pack is also located in the same position on board 25 for all receivers considerably simplifying manufacturing and assembly over present techniques.

What is claimed is:

1. A video display device having a cabinet, a CRT mounted in the cabinet and a common chassis standardized for a plurality of different receivers each having cabinets with standardized apertures for receiving the chassis, comprising: a cabinet including a front for receiving the CRT and having a planar bottom wall standardized for different size CRTs and a rear cover, a generally horizontally planar rectangular chassis frame constructed to mate with different size CRTs and mounted on the standardized cabinet bottom wall unattached to side walls and having slot means for receiving at least one circuit board, a CRT mounted in the cabinet separately from the chassis frame, at least one circuit board slidably received in the frame slot means, means attached to the frame for holding the circuit board in the frame slot means, said cabinet front bottom wall extending completely under the chassis frame and having a plurality of apertures therein, friction lock means on the frame for holding the chassis in the cabinet bottom wall apertures without fasteners and without any positive locking, said friction lock means including a plurality of projections extending downwardly and forwardly from underneath the chassis frame positioned to guide the chassis into its friction held position on the bottom wall, and projection means on the cabinet rear cover to prevent rearward movement of the chassis frame so the chassis frame can be easily removed when the cabinet rear cover is removed.

2. A video display device having a cabinet, a CRT mounted in the cabinet and a common chassis standardized for a plurality of different receivers as defined in claim 1, wherein each of the downwardly and forwardly extending projections on the lower surface of the frame are arranged to be engageable with one of the apertures in the cabinet so the chassis can be mounted in the cabinet by sliding it forwardly on the cabinet bottom wall until the locking projections drop in the cabinet apertures.

3. A video display device having a cabinet, a CRT mounted in the cabinet and a common chassis standardized for a plurality of different receivers as defined in claim 1, wherein said cabinet has side walls positioned to guide the chassis frame as it is slid forwardly into the cabinet.

4. A video display device having a cabinet, a CRT mounted in the cabinet and a common chassis standardized for a plurality of different receivers as defined in claim 1, wherein the slot means in the chassis frame is constructed to hold the circuit board in position without any fasteners extending between the circuit board and the frame.

5. A video display device having a cabinet, a CRT mounted in the cabinet and a common chassis standardized for a plurality of different receivers as defined in claim 4, wherein the slot means in the chassis frame is defined by a plurality of horizontal tabs extending in a first common plane and a second plurality of horizontal tabs extending in a second common plane spaced from the first plane a distance approximately the thickness of the circuit board.

6. A video display device having a cabinet, a CRT mounted in the cabinet and a common chassis standardized for a plurality of different receivers as defined in claim 1, wherein the means for holding the circuit board in the slot means in the chassis frame includes a removable back frame that prevents rearward sliding of the circuit board in the frame.

7. A video display device having a cabinet, a CRT mounted in the cabinet and a common chassis standardized for a plurality of different receivers as defined in claim 6, wherein the back frame and chassis frame have snap-lock connectors.

8. A video display device having a cabinet, a CRT mounted in the cabinet and a common chassis standardized for a plurality of different model receivers, comprising: a cabinet including a front for receiving the CRT and having a standardized planar bottom wall and a rear cover, a one-piece horizontally planar plastic chassis frame without side walls constructed to mate with a plurality of different size CRTs and releasably attached in the standardized cabinet bottom wall, a CRT mounted in the cabinet separately from the chassis frame, at least one circuit board mounted in the frame, a slot in the frame that permits the circuit board to be mounted in the frame without any fasteners extending between the circuit board and the frame, whereby the circuit board may be easily assembled into the frame and later easily removed for service, said cabinet bottom wall extending completely under the chassis frame and having a plurality of apertures therein, and camming projections on the chassis frame for frictionally urging the chassis frame downwardly against the cabinet bottom wall as the chassis is slid forwardly on the bottom wall and the projections engaged in the bottom wall apertures, said chassis frame being unlocked from the cabinet front so it may be easily removed therefrom when the cabinet cover is removed.

9. A video display device having a cabinet, a CRT mounted in the cabinet, and a common chassis standardized for a plurality of different model television receivers as defined in claim 8, wherein said frame camming projections include a plurality of downwardly and forwardly extending projections that frictionally lock in the cabinet apertures as the chassis is slid forwardly in the cabinet.

10. A video display device having a cabinet, a CRT mounted in the cabinet, and a common chassis standardized for a plurality of different model receivers as defined in claim 9, wherein the cabinet has parallel side walls positioned to guide the chassis as it is slid forwardly into the cabinet.

11. A video display device having a cabinet, a CRT mounted in the cabinet, and a common chassis standardized for a plurality of different model television receivers as defined in claim 8, wherein the cabinet includes a removable rear cover that engages the chassis frame to prevent rearward movement of the chassis in the cabinet.

12. A video display device having a cabinet, a CRT mounted in the cabinet, and a common chassis standardized for a plurality of different model receivers as defined in claim 8, wherein the slot in the chassis frame is defined by a plurality of horizontal tabs extending in a first common plane and a second plurality of horizontal tabs extending in a second common plane spaced from the first plane a distance approximately the thickness of the circuit board.

13. A video display device having a cabinet, a CRT mounted in the cabinet, and a common chassis standardized for a plurality of different model television receivers as defined in claim 8, wherein the chassis frame includes a removable back frame that prevents rearward sliding of the circuit board in the frame.

14. A video display device having a cabinet, a CRT mounted in the cabinet, and a common chassis standardized for a plurality of different receivers each having cabinets with standardized apertures for receiving the chassis, comprising: a cabinet including a front for receiving the CRT and having a standardized planar bottom wall and a rear cover, a generally rectangular horizontally planar chassis frame without side walls constructed to mate with a plurality of different size CRTs and releasably mounted in the standardized chassis bottom wall, said frame having slot means for receiving at least one circuit board, at least one circuit board slidably received in the frame slot means, a CRT mounted in the cabinet separately from the chassis frame, means for holding the circuit board in the frame slot means, friction lock means on the frame for holding the chassis in the standardized cabinet apertures without any fasteners, said slot means in the frame being without any fasteners extending between the circuit board and the frame, whereby the circuit board may be easily assembled into the frame and later easily removed for service, said cabinet bottom wall extending completely under the chassis frame and having a plurality of apertures therein, said frame having a plurality of downwardly and forwardly extending projections that frictionally lock in the cabinet apertures as the chassis is slid forwardly in the cabinet, the cabinet having upstanding side walls positioned to guide the chassis as it is slid forwardly into the cabinet, the frame also including a removable back frame that prevents rearward sliding of the circuit board in the frame, and a projection on the rear cover engaging the chassis frame.

* * * * *